(12) United States Patent
Liu et al.

(10) Patent No.: US 9,431,964 B2
(45) Date of Patent: Aug. 30, 2016

(54) OPERATIONAL AMPLIFIER AND METHOD OF OPERATING THE OPERATIONAL AMPLIFIER

(71) Applicant: Beken Corporation, Shanghai (CN)

(72) Inventors: Jiazhou Liu, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 18 days.

(21) Appl. No.: 14/585,190

(22) Filed: Dec. 30, 2014

(65) Prior Publication Data

US 2016/0156313 A1    Jun. 2, 2016

(30) Foreign Application Priority Data

Dec. 2, 2014 (CN) .......................... 2014 1 0723184

(51) Int. Cl.
| | |
|---|---|
| *H03F 3/45* | (2006.01) |
| *H03F 1/02* | (2006.01) |
| *H03F 3/217* | (2006.01) |
| *H03F 3/21* | (2006.01) |

(52) U.S. Cl.
CPC ............. *H03F 1/0205* (2013.01); *H03F 3/211* (2013.01); *H03F 3/2171* (2013.01); *H03F 3/45179* (2013.01); *H03F 2203/21109* (2013.01); *H03F 2203/45116* (2013.01)

(58) Field of Classification Search
CPC .... H03F 1/0205; H03F 3/211; H03F 3/2171; H03F 3/45179; H03F 2203/21109; H03F 2203/45116
USPC ............................................ 330/69, 252–261
See application file for complete search history.

(56) References Cited

U.S. PATENT DOCUMENTS

| | | | | |
|---|---|---|---|---|
| 6,380,805 | B1* | 4/2002 | Bily ...................... | H03F 3/4521 |
| | | | | 330/253 |
| 6,462,619 | B1* | 10/2002 | Ivanov ................ | H03F 3/45219 |
| | | | | 330/253 |
| 2006/0125563 | A1* | 6/2006 | Elder ........................ | H03F 1/30 |
| | | | | 330/253 |

* cited by examiner

*Primary Examiner* — Steven J Mottola
*Assistant Examiner* — Hafizur Rahman
(74) *Attorney, Agent, or Firm* — Perkins Coie LLP

(57) ABSTRACT

An operational amplifier comprises a first input pair, a second input pair, a switch and a first current mirror. The first input pair comprises a different type of MOS transistor from the second input pair. The switch determines which one of the first or the second input pair is functioning and the operating input pair is configured to output voltage. The switch is further connected to the first input pair and the first current mirror. The first current mirror is further connected to the second input pair, and is configured to copy a current passing through the switch to the second input pair. Therefore an increase of transconductance of the first input pair is compensated by a decrease of transconductance of the second input pair, and the operational amplifier has a substantially constant transconductance no matter which of the first input pair and the second input pair is functioning.

16 Claims, 6 Drawing Sheets

OPERATIONAL AMPLIFIER AND METHOD OF OPERATING THE OPERATIONAL AMPLIFIER

CLAIM OF PRIORITY

This application claims priority to Chinese Application No. 201410723184.4 entitled "Operational amplifier and method of operating the operational amplifier," filed on Dec. 2, 2014 by Beken Corporation, which is incorporated herein by reference.

TECHNICAL FIELD

The present application relates to circuits, and more particularly but not exclusively to an operational amplifier and method of operating the operational amplifier.

BACKGROUND

Conventional operational amplifiers use both a PMOS transistor pair and a NMOS transistor pair to alternate functioning so as to ensure that the operational amplifier can be operating when the input signal ranges from ground to the positive power supply (vdd). However, there are cases when both the PMOS transistor pair and the NMOS transistor are functioning, or neither the PMOS transistor pair nor the NMOS transistor pair is functioning, which means a changing transconductance of the operational amplifier and resulting in a distortion of output signal. Therefore, it is desirable to design an operational amplifier with substantially constant transconductance.

SUMMARY OF THE INVENTION

In an embodiment, an operational amplifier comprises a first input pair, a second input pair, a switch and a first current mirror, wherein the first input pair comprises a different type of MOS transistor from the second input pair; the switch is configured to determine which one of the first input pair or the second input pair is functioning, wherein the switch is further connected to the first input pair and the first current mirror, and the operating input pair is configured to output voltage; and the first current mirror is further connected to the second input pair, and is configured to copy a current passing through the switch to the second input pair, such that the operational amplifier has a substantially constant transconductance no matter which of the first input pair and the second input pair is functioning.

Another embodiment discloses a method in an operational amplifier. The operational amplifier comprises a first MOS transistor, a second MOS transistor, a third MOS transistor, a fourth MOS transistor and a fifth MOS transistor, a third current mirror, a second current mirror, a first current mirror and a load unit, wherein first nodes of the first and second MOS transistors are both connected to both a first current source and a first node of the fifth MOS transistor; a second node of the first MOS transistor is connected to a second node of the fourth MOS transistor, a third node of the first transistor is connected to both a second port of the third current mirror and a first port of the load unit; a second node of the second MOS transistor is connected to a second node of the third MOS transistor, a third node of the second transistor is connected to both a second port of the second current mirror and a second node of the load unit. First nodes of both the third and fourth MOS transistors are connected to a first port of the first current mirror, a third node of the third MOS transistor is connected to a first port of the third current mirror, a third node of the fourth MOS transistor is connected to a first port of the second current mirror; a second node of the fifth MOS transistor is connected to a voltage source, a third node of the fifth MOS transistor is connected to a second port of the first current mirror. The method comprises receiving, at the second node of the first MOS transistor, a positive input; receiving, at the second node of the second MOS transistor, a negative input; and outputting an output voltage at the third node of the second MOS transistor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
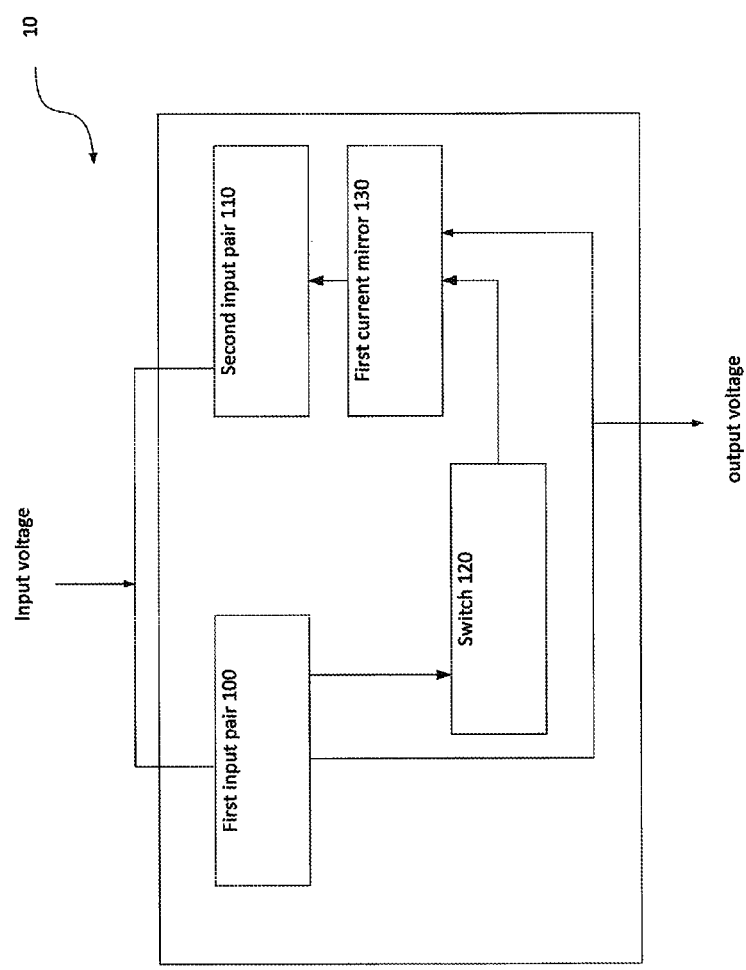
FIG. 1 is a diagram illustrating an embodiment of an operational amplifier.

FIG. 1 is a diagram illustrating an embodiment of an operational amplifier. The operational amplifier 10 comprises a first input pair 100, a second input pair 110, a switch 120 and a first current mirror 130. The first input pair 100 comprises a MOS transistor different from that of the second input pair 110. For example, when the first input pair 110 comprises PMOS transistors, then the second input pair 1.20 comprises NMOS transistors. When the first input pair 110 comprises NMOS transistors, then the second input pair 120 comprises PMOS transistors. The switch 120 is configured to determine which one of the first input pair 100 or the second input pair 110 is functioning. The switch 120 is further connected to the first input pair 100 and the first current mirror 130. The input pair functioning. is configured to output voltage. For example, if the switch 120 determines that the first input pair 100 is functioning, then the first input pair 100 outputs voltage. If the switch 120 determines that the second input pair 110 is functioning, then the second input pair 110 outputs voltage. The first current mirror 130 is further connected to the second input pair 110, and is configured to copy a current passing through the switch 120 to the second input pair 110, such that the operational amplifier 10 has a substantially constant transconductance no matter which of the first input pair 100 and the second input pair 110 is functioning.

Alternatively, at least one of the first input pair 100 and the second input pair 110 is configured to be functioning during the operation range of the operational amplifier 10.

Figure 2:
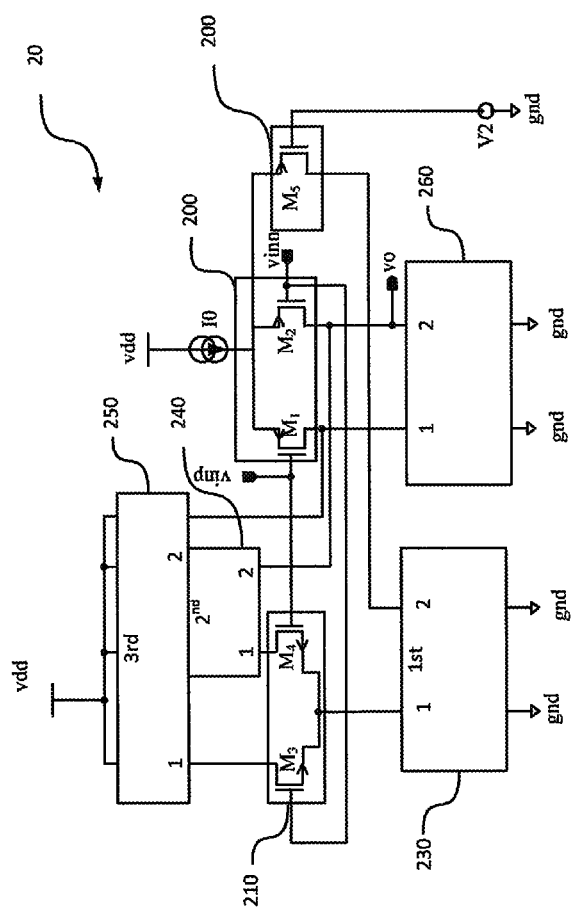
FIG. 2 is a diagram illustrating another embodiment of an operational amplifier.

FIG. 2 is a diagram illustrating another embodiment of an operational amplifier 20. The operational amplifier 20 also comprises a first input pair 200, a second input pair 210, a switch 220 and a first current mirror 230. To be more specific, the first input pair 200 comprises a first MOS transistor $M_1$ and a second MOS transistor $M_2$. The second input pair 210 comprises a third MOS transistor $M_3$ and a fourth MOS transistor $M_4$. The switch 200 comprises a fifth MOS $M_5$. The operational amplifier further comprises a second current mirror 240, a third current mirror 250 and a load unit 260.

Any two of a first node of the first MOS transistor $M_1$, a first node of the second MOS transistor $M_2$, a first current source to and a first node of the fifth MOS transistor $M_5$ are connected. A second node of the first MOS transistor $M_1$ is connected to a second node of the fourth MOS transistor $M_4$ and the second node of the first MOS transistor $M_1$ is also configured to receive a positive input vine. A third node of the first transistor $M_1$ is connected to both a second port of the third current mirror 250 and a first port of the load unit 260. A second node of the second MOS transistor $M_2$ is connected to a second node of the third MOS transistor $M_3$ and the second node of the second MOS transistor $M_2$ is also configured to receive a negative input vinn. A third node of the second transistor $M_2$ is connected to both a second port of the second current mirror 240 and a second node of the load unit 260 and the third node of the second transistor $M_2$ is also configured to output voltage.

First nodes of both the third and fourth MOS transistors $M_3$, $M_4$ are connected to a first port of the first current mirror 230. A third node of the third MOS transistor $M_3$ is connected to a first port of the third current mirror 250. A third node of the fourth MOS transistor $M_4$ is connected to a first port of the second current mirror 240.

A second node of the fifth MOS transistor $M_5$ is connected to a voltage source V2, and the voltage source V2 is connected to ground. A third node of the fifth MOS transistor $M_5$ is connected to a second port of the first current mirror 230.

The first node of the first current mirror 230 has a current that mirrors the second node of the first current mirror 230. The first node of the second current mirror 240 has a current that mirrors the second node of the second current mirror 240. The third node of the first current mirror 240 has a current that mirrors the second node of the third current mirror 240.

Figure 3:
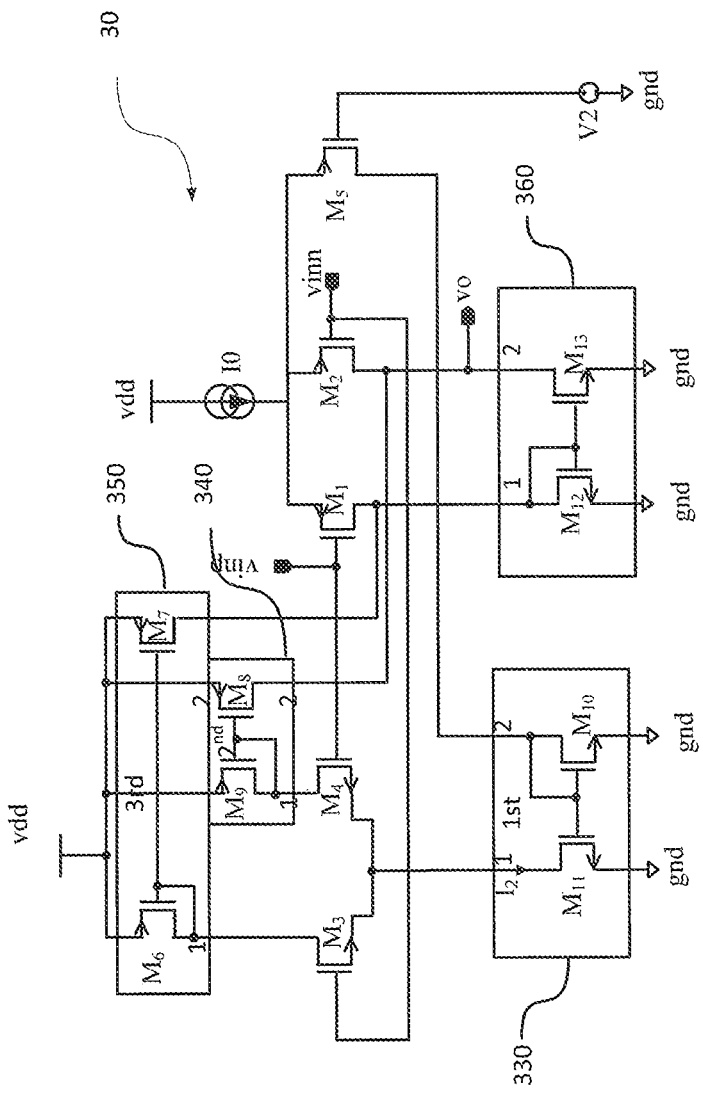
FIG. 3 is a diagram illustrating a specific implementation of the operational amplifier shown in FIG. 2.

FIG. 3 is a diagram illustrating a specific implementation of the operational amplifier 30 shown in FIG. 2, The operational amplifier 30 comprises a first MOS transistor $M_1$, a second MOS transistor $M_2$, a third MOS transistor $M_3$, a fourth MOS transistor $M_4$ and a fifth MOS transistor $M_5$, a first current mirror 330, a second current mirror 340, a third current mirror 350 and a load unit 360. The connection relationship among these elements are similar to that of FIG. 2, and details are omitted for elements already described with respect to FIG. 2.

As shown in FIG. 3, the third current mirror 350 comprises a sixth MOS transistor $M_6$ and a seventh MOS transistor $M_7$. First nodes of both the sixth and the seventh MOS transistors $M_6$, $M_7$ are connected to a first power source. Both second and third nodes of the sixth MOS transistor $M_6$ are connected to both a second node of the seventh MOS transistor $M_7$ and the third node of the third MOS transistor $M_3$. The first port of the third current mirror 350 comprises the third node of the sixth MOS transistor $M_6$. The second port of the third current mirror 350 comprises a third node of the seventh MOS transistor $M_7$.

Alternatively, the second current mirror 340 comprises an eighth MOS transistor $M_8$ and a ninth MOS transistor $M_9$. First nodes of both the eighth and the ninth MOS transistors $M_8$ and $M_9$ are connected to the first power source. Both second and third nodes of the ninth MOS transistor $M_9$ are connected to a second node of the eighth MOS transistor $M_8$ and the third node of the fourth MOS transistor $M_4$. The first port of the second current mirror 340 comprises the third node of the ninth MOS transistor $M_9$, and the second port of the second current mirror 340 comprises a third node of the eighth MOS transistor $M_8$.

The first current mirror 330 comprises a tenth MOS transistor $M_{10}$ and an eleventh MOS transistor $M_{11}$. First nodes of both the tenth and the eleventh MOS transistors $M_{10}$ and $M_{11}$ are connected to the second power source. Both second and third nodes of the tenth MOS transistor $M_{10}$ are connected to both a second node of the eleventh MOS transistor $M_{11}$ and the third node of the fifth MOS transistor $M_5$. The first port of the first current mirror 330 comprises a third node of the eleventh MOS transistor $M_{11}$. The second port of the first current mirror 330 comprises the third node of the tenth MOS transistor $M_{10}$.

Alternatively, the load unit 360 comprises a twelfth MOS transistor $M_{12}$ and a thirteenth MOS transistor $M_{13}$. First nodes of both the twelfth MOS transistor $M_{12}$ and the thirteenth MOS transistor $M_{13}$ are connected to the second power source. A second node and a third node of the twelfth MOS transistor $M_{12}$ are both connected to a second node of the thirteenth MOS transistor $M_{13}$. A third node of the twelfth MOS transistor $M_{13}$ comprises the first node of the load unit 360. A third node of the thirteenth MOS $M_{13}$ comprises the second node of the load unit 360.

As shown in FIG. 3, the first, the second, the fifth, the sixth, the seventh, the eighth and the ninth MOS transistors $M_1$, $M_2$, $M_5$, $M_6$, $M_7$, $M_8$ and $M_9$ are PMOS transistors. The third, the fourth, the tenth, and the eleventh MOS transistors $M_3$, $M_4$, $M_{10}$, $M_{11}$, $M_{12}$, and $M_{13}$ are NMOS transistors.

The first node of each of the transistors is a source, the second node of each of the transistors is a gate, and the third node of each of the transistors is a drain. The first power source comprises a positive power source Vdd, and the second power source comprises ground (gnd).

Referring to FIG. 3, during operation, when vinp=vinn>V2, the PMOS transistors $M_1$ and $M_2$, which includes the first input pair, are off, and the switch 200, which for example, includes the fifth PMOS transistor $M_5$ is on. The current that passes through the fifth PMOS transistor $M_5$ is copied by the current mirror 330 to the second input pair, represented as current $I_2$, therefore the second input pair, which for example, includes the third NMOS transistor $M_3$ and the fourth NMOS transistor $M_4$, is on. The current $I_2$ works as a current sink for the third NMOS transistor $M_3$ and the fourth NMOS transistor $M_4$. On the other hand, when vinp=vinn<V2, the PMOS transistors $M_1$ and $M_2$, which includes the first input pair, are on, and the switch 200, which for example, includes the fifth PMOS transistor $M_5$, is off No current passes through the fifth PMOS transistor $M_5$. As a result, no current is copied by the current mirror 330 to the second input pair, which for example, includes the third NMOS transistor $M_3$ and the fourth NMOS transistor $M_4$. Therefore the second input pair is off.

As the operational amplifier with the input pairs is functioning when an input signal varies from almost ground to vdd, the operational amplifier is also called rail-to-rail operational amplifier. Further, as normally only one input pair works during the overall operation range of the operational amplifier, the manufacture parameters can be selected so that the NMOS input pair matches the PMOS input pair, and the operational amplifier may have a substantially constant transconductance no matter which one of the NMOS input pair or the PMOS input pair works.

Even if both NMOS input pair and the PMOS input pair work simultaneously in some circumstances, as the first input pair comprises PMOS transistors, the second input pair comprises NMOS transistors, the variation of current that passes through the PMOS input pair is opposite to the variation of current that passes through the NMOS input pair, therefore the substantially constant transconductance can be easily obtained.

In an embodiment, as $M_5$ operates as common mode circuit to the differential input, the PMOS transistor $M_5$ does not generate differential noise to the circuit with differential input, and the circuit will not generate extra noise. Further, the circuit eliminates dead zone as only one device $M_5$ is used to control whether PMOS pair or NMOS pair works. Dead zone means neither the PMOS input pair, nor the NMOS input pair is on.

Figure 4:
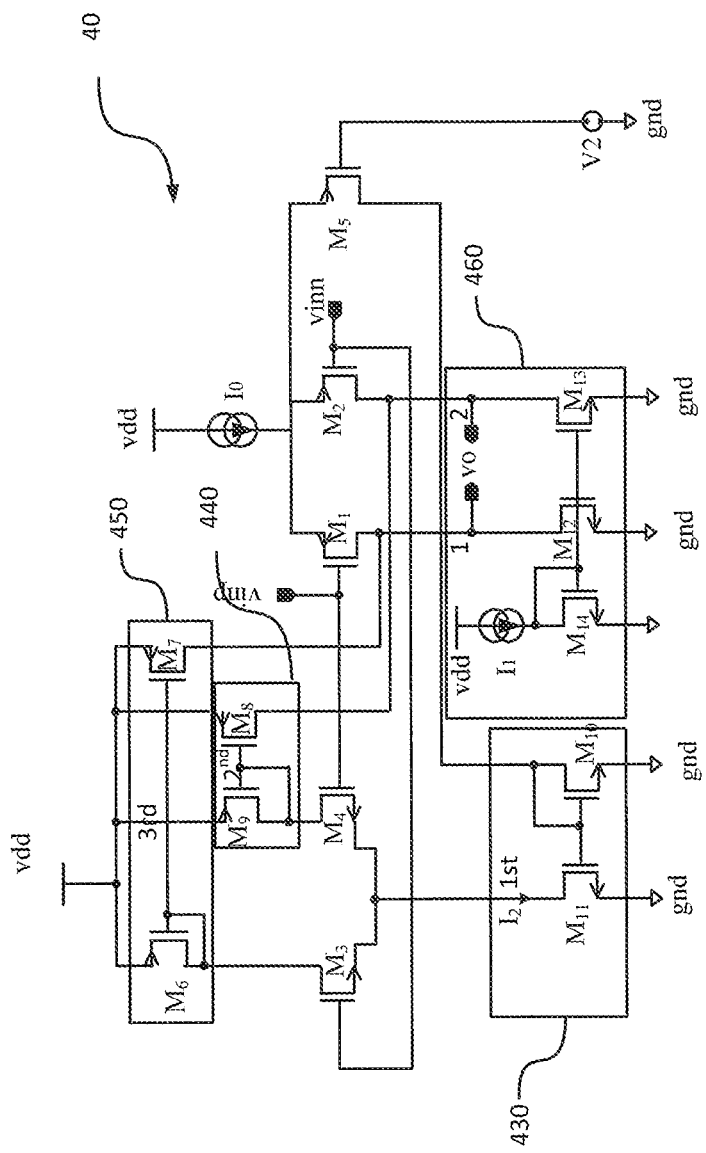
FIG. 4 is a diagram illustrating another specific implementation of the operational amplifier shown in FIG. 2.

FIG. 4 is a diagram illustrating another specific implementation of the operational amplifier 40 shown in FIG. 2. As other components such as first current mirror 430, second current mirror 440 and third current mirror 450 except the loading unit 460 in the operational amplifier 40 are similar to that shown in FIG. 3, details are omitted for elements already described with respect to FIG. 2 and FIG. 3. Alternatively, the load unit 460 comprises a twelfth MOS transistor $M_{12}$, a thirteenth MOS transistor $M_{13}$, a fourteenth MOS transistor $M_{14}$ and a second current source $I_1$. The first nodes of all the twelfth MOS transistor $M_{12}$, the thirteenth MOS $M_{13}$ transistor and the fourteenth MOS transistor $M_{14}$ are connected to the second power source. A second node of the twelfth MOS transistor $M_{12}$ is connected to second nodes of both the thirteenth MOS transistor $M_{13}$ and the fourteenth MOS transistor $M_{14}$. The second node of the fourteenth MOS transistor $M_{14}$ is also connected to both a third node of the fourteenth MOS transistor $M_{14}$ and the second current source $I_1$. A third node of the twelfth MOS transistor $M_{12}$ comprises the first node of the load unit 460 and a third node of the thirteenth MOS transistor $M_{13}$ comprises the second node of the load unit 460. The first node and the second node of the load unit 460 are configured to output differential output voltage vo.

Figure 5:
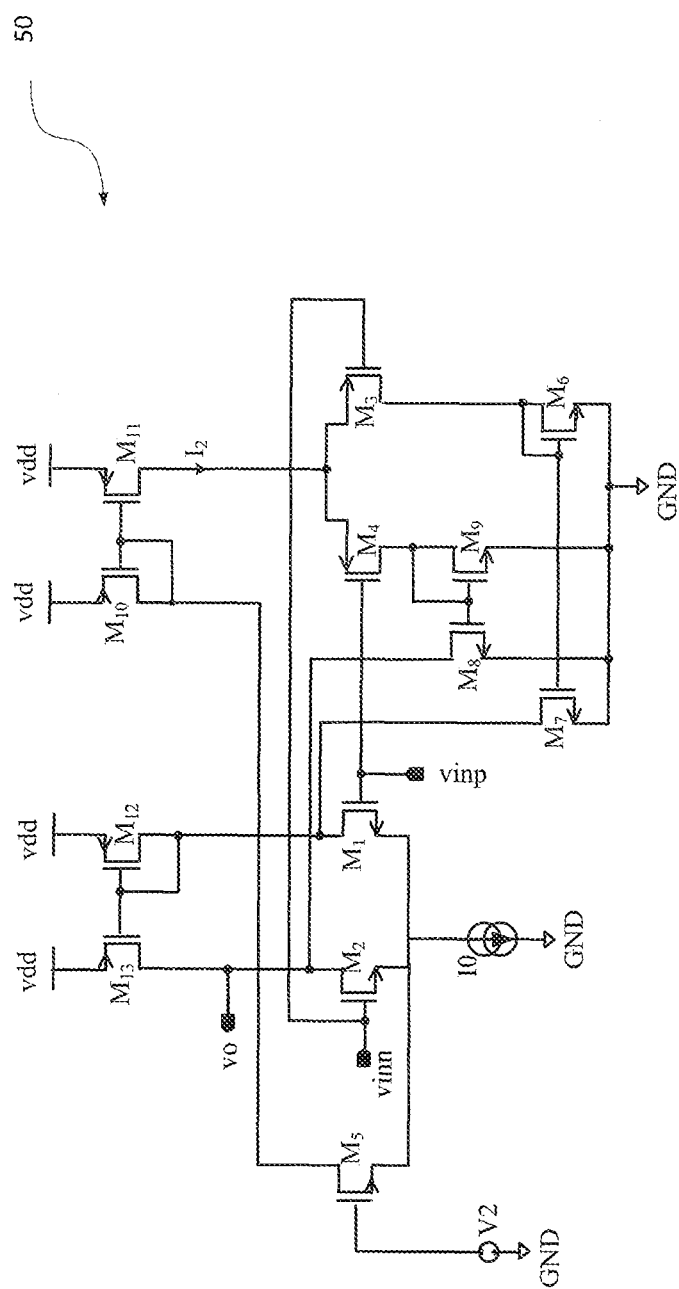
FIG. 5 is a diagram illustrating another specific implementation of the operational amplifier shown in FIG. 2.

FIG. 5 is a diagram illustrating another specific implementation of the operational amplifier 50 shown in FIG. 2. As shown in the operational amplifier 50 in FIG. 5, the first, the second, the fifth, the sixth, the seventh, the eighth and the ninth MOS transistors $M_1$, $M_2$, $M_5$, $M_6$, $M_7$, $M_8$ and $M_9$ are NMOS transistors. The third, the fourth, the tenth, and the eleventh, the twelfth and the thirteenth MOS transistors $M_3$, $M_4$, $M_{10}$, $M_{11}$, $M_{12}$, $M_{13}$ are PMOS transistors. The first node of each of the transistors is a source, the second node of each of the transistors is a gate, and the third node of each of the transistors is a drain. The first power source comprises a ground. GND, and the second power source comprises a positive power supply Vdd. The voltage source V2 is connected to ground.

Referring to FIG. 5, during operation, when vinp=vinn>V2, the NMOS transistors $M_1$ and $M_2$, which comprise the second input pair, are on, and the fifth NMOS transistor $M_5$ is off. No current passes through the fifth NMOS transistor $M_5$. As a result, no current is copied by the first current mirror, which comprises the tenth PMOS transistor $M_{10}$ and the eleventh PMOS transistor $M_{11}$, to the third PMOS transistor $M_3$ and the fourth PMOS transistor $M_4$, which comprise the second input pair. Therefore the second input pair is off. When vinp=vinn<V2, the NMOS transistors $M_1$ and $M_2$, which includes the first input pair, are off, and the fifth NMOS transistor $M_5$ is on. The current that passes through the fifth NMOS transistor $M_5$ is copied by the first current mirror to the second input pair, which for example, includes the third PMOS transistor $M_3$ and the fourth PMOS transistor $M_4$, therefore the second input pair is on. The current $I_2$ works as a current source for the third PMOS transistor $M_3$ and the fourth PMOS transistor $M_4$.

As the operational amplifier with the input pairs is functioning during the whole range that an input signal that varies from almost ground to vdd, the operational amplifier is also called rail-to-rail operational amplifier. Further, as normally only one input pair works during the overall operation range of the operational amplifier, the manufacture parameters can be selected so that the NMOS input pair matches the PMOS input pair, and the operational amplifier may have a substantially constant transconductance no matter which one of the NMOS input pair or the PMOS input pair works.

Even if both NMOS input pair and the PMOS input pair work simultaneously in some circumstances, as the first input pair comprises NMOS transistors, the second input pair comprises PMOS transistors, the variation of current that passes through the first input pair is opposite to the variation of current that passes through the second input pair, therefore the substantially constant transconductance can be easily obtained.

In an embodiment, as $M_5$ operates as common mode circuit to the differential input, the NMOS transistor $M_5$ does not generate differential noise to the circuit with differential input, the circuit will not generate extra noise. As the circuit will not generate extra noise, the circuit will not consume extra current, which is advantageous for reducing power consumption and reducing noise. Further, the circuit eliminates dead zone as only one device $M_5$ is used to control whether PMOS pair or NMOS pair works. Dead zone means neither the PMOS input pair, nor the NMOS input pair is on.

Figure 6:
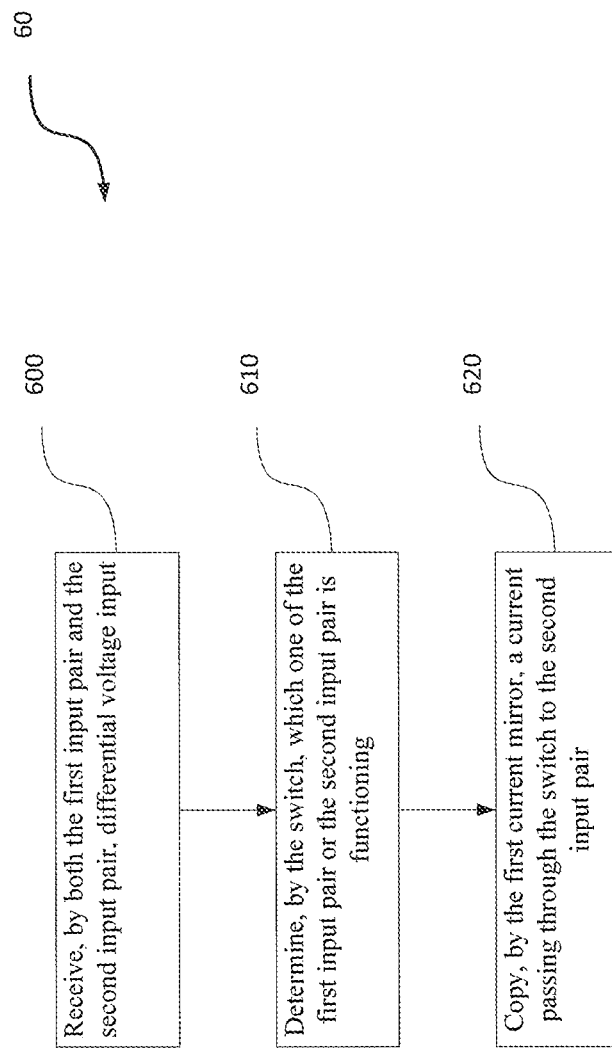
FIG. 6 is a flow chart of a method of operating the operational amplifier.

FIG. 6 is flow chart of a method 60 of operating the operational amplifier. The method 60 operates in an operational amplifier. Referring back to FIG. 1, the operational amplifier comprises a first input pair 100, a second input pair 110, a switch 120 and a first current mirror 130. The first input pair 110 comprises a different type of MOS transistor from the second input pair 110, For example, when the first input pair 110 comprises PMOS transistor, then the second input pair 120 comprises NMOS transistor. When the first input pair 110 comprises NMOS transistor, then the second input pair 120 comprises PMOS transistor. The switch 120 is configured to determine which one of the first input pair 100 or the second input pair 110 is functioning. The switch 120 is further connected to the first input pair 100 and the first current mirror 130. The input pair functioning is configured to output voltage. For example, if the switch 120 determines that the first input pair 100 is functioning, then the first input pair 100 outputs voltage. if the switch 120 determines that the second input pair 110 is functioning, then the second input pair 110 outputs voltage. The first current mirror 130 is further connected to the second input pair 110, and is configured to copy a current passing through the switch 120 to the second input pair 110 such that the operational amplifier 10 has a substantially constant transconductance no matter which of the first input pair 100 and the second input pair 110 is functioning.

The method 60 comprises receiving (in block 600), by both the first input pair and the second input pair, differential voltage input; determining (in block 610), by the switch, which one of the first input pair or the second input pair is functioning; copying (in block 620), by the first current mirror, a current passing through the switch to the second input pair, such that the operational amplifier has a substantially constant transconductance, no matter which of the first input pair and the second input pair is functioning, In an alternative embodiment, when the first input pair and the second input pair are functioning simultaneously, an increase of transconductance of the first input pair is compensated by a decrease of transconductance of the second input pair.

In an embodiment, the determining (in block 610) may be performed as follows: in case that transistors $M_1$, $M_2$ and $M_5$ are NMOS transistors, and $M_3$ and $M_4$ are PMOS transistors as shown in FIG. 5, if vinp=vinn>V2, the NMOS transistors $M_1$ and $M_2$ are on, and the fifth NMOS transistor $M_5$ is off, then the fifth PMOS transistor M5 determines $M_1$ and $M_2$ are on, and $M_3$ and M4 are off. If vinp=vinn<V2, the NMOS transistors $M_1$ and $M_2$ are off, and the fifth NMOS transistor $M_5$ is on, then $M_5$ determines $M_1$ and $M_2$ are off, and $M_3$ and $M_4$ are on.

In another embodiment, the determining (in block 610) may be performed as follows: in case that transistors $M_1$, $M_2$ and $M_5$ are PMOS transistors, and $M_3$ and $M_4$ are NMOS transistors as shown in FIG. 2, if vinp=vinn>V2, the PMOS transistors $M_1$ and $M_2$ are off, and the fifth PMOS transistor $M_5$ is on, then the fifth PMOS transistor $M_5$ determines transistors $M_1$ and $M_2$ are off, and transistors $M_3$ and $M_4$ are on. If vinp=vinn<V2, the PMOS transistors $M_1$ and $M_2$ are on, and the fifth PMOS transistor $M_5$ is off, then the transistor $M_5$ determines transistors $M_1$ and $M_2$ are on, and transistors $M_3$ and $M_4$ are off.

It should be appreciated by those ordinary skill in the art that components from different embodiments may be combined to yield another technical solution. This written description uses examples to disclose the invention, including the best mode, and also to enable any person ordinary skill in the art to practice the invention, including making and using any devices or systems and performing any incorporated methods. The patentable scope of the invention is defined by the claims, and may include other examples that occur to those ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. An operational amplifier comprising a first input pair, a second input pair, a switch and a first current mirror,
wherein the first input pair comprises a different type of MOS transistor from the second input pair;
the switch is configured to determine which one of the first input pair or the second input pair is functioning, wherein the switch is further connected to the first input pair and the first current mirror, and the input pair functioning is configured to output voltage; and
the first current mirror is further connected to the second input pair, and is configured to copy a current passing through the switch to the second input pair, such that the operational amplifier has a substantially constant transconductance no matter which of the first input pair and the second input pair is functioning,
wherein the first input pair comprises a first MOS transistor and a second MOS transistor, the second input pair comprises a third MOS transistor and a fourth MOS transistor, the switch comprises a fifth MOS, and the operational amplifier further comprises a second current mirror, a third current mirror and a load unit;
wherein any two of a first node of the first MOS transistor, a first node of the second MOS transistor, a first current source and a first node of the fifth MOS transistor are connected; a second node of the first MOS transistor is connected to a second node of the fourth MOS transistor and is also configured to receive a positive input, a third node of the first transistor is connected to both a second port of the third current mirror and a first port of the load unit; a second node of the second MOS transistor is connected to a second node of the third MOS transistor and is also configured to receive a negative input, a third node of the second transistor is connected to both a second port of the second current mirror and a second node of the load unit and is also configured to output voltage;
first nodes of both the third and fourth MOS transistors are connected to a first port of the first current mirror, a third node of the third MOS transistor is connected to a first port of the third current mirror, a third node of the fourth MOS transistor is connected to a first port of the second current mirror;
a second node of the fifth MOS transistor is connected to a voltage source, a third node of the fifth MOS transistor is connected to a second port of the first current mirror, wherein
the third current mirror comprises a sixth MOS transistor and a seventh MOS transistor, first nodes of both the sixth and the seventh MOS transistors are connected to a first power source, both second and third nodes of the sixth MOS transistor are connected to both a second node of the seventh MOS transistor and the third node of the third MOS transistor, and the first port of the third current mirror comprises the third node of the sixth MOS transistor, and the second port of the third current mirror comprises a third node of the seventh MOS transistor;
the second current mirror comprises an eighth MOS transistor and a ninth MOS transistor, first nodes of both the eighth and the ninth MOS transistors are connected to the first power source, both second and third nodes of the ninth MOS transistor are connected to a second node of the eighth MOS transistor and the third node of the fourth MOS transistor, and the first port of the second current mirror comprises the third node of the ninth MOS transistor, and the second port of the second current mirror comprises a third node of the eighth MOS transistor; and
the first current mirror comprises a tenth MOS transistor and an eleventh MOS transistor, first nodes of both the tenth and the eleventh MOS transistors are connected to the second power source, both second and third nodes of the tenth MOS transistor are connected to both a second node of the eleventh MOS transistor and the third node of the fifth MOS transistor, and the first port of the first current mirror comprises a third node of the eleventh MOS transistor, and the second port of the first current mirror comprises the third node of the tenth MOS transistor.

2. The operational amplifier of claim 1, wherein at least one of the first input pair and the second input pair is configured to be functioning during the operation range of the operational amplifier.

3. The operational amplifier of claim 1, wherein the load unit comprises a twelfth MOS transistor and a thirteenth MOS transistor;
wherein first nodes of both the twelfth MOS transistor and the thirteenth MOS transistor are connected to the second power source, a second node and a third node of the twelfth MOS transistor are both connected to a second node of the thirteenth MOS transistor, a third node of the twelfth MOS transistor comprises the first node of the load unit and a third node of the thirteenth MOS comprises the second node of the load unit.

4. The operational amplifier of claim 1, wherein the load unit comprises a twelfth MOS transistor, a thirteenth MOS transistor, a fourteenth MOS transistor and a second current source;
wherein first nodes of all the twelfth MOS transistor, the thirteenth MOS transistor and the fourteenth MOS transistor are connected to the second power source, a second node of the twelfth MOS transistor is connected to second nodes of both the thirteenth MOS transistor and the fourteenth MOS transistor, the second node of the fourteenth MOS transistor is also connected to both a third node of the fourteenth MOS transistor and the second current source, a third node of the twelfth MOS transistor comprises the first node of the load unit and a third node of the thirteenth MOS transistor comprises the second node of the load unit, wherein the first node and the second node of the load unit are configured to output differential output voltage.

5. The operational amplifier of claim 1, wherein the first, the second, the fifth, the sixth, the seventh, the eighth and the ninth MOS transistors are PMOS transistors, the third, the fourth, the tenth, and the eleventh MOS transistors are NMOS transistors; and
the first node of each of the transistors is a source, the second node of each of the transistors is a gate, and the third node of each of the transistors is a drain, the first power source comprises a positive power source, and the second power source comprises ground.

6. The operational amplifier of claim 3, wherein the twelfth and the thirteenth MOS transistors are NMOS transistors, and
the first node of each of the twelfth and the thirteenth MOS transistors is a source, the second node of each of the twelfth and the thirteenth transistors is a gate, and the third node of each of the twelfth and the thirteenth transistors is a drain.

7. The operational amplifier of claim 1, wherein the first, the second, the fifth, the sixth, the seventh, the eighth and the ninth MOS transistors are NMOS transistors, the third, the fourth, the tenth, and the eleventh MOS transistors are PMOS transistors; and
the first node of each of the transistors is a source, the second node of each of the transistors is a gate, and the third node of each of the transistors is a drain, the first power source comprises a ground, and the second power source comprises a positive power supply.

8. The operational amplifier of claim 3, wherein the twelfth and the thirteenth MOS transistors include PMOS transistors, and
the first node of each of the twelfth and the thirteenth MOS transistors include a source, the second node of each of the twelfth and the thirteenth transistors include a gate, and the third node of each of the twelfth and the thirteenth transistors include a drain.

9. A method in an operational amplifier, wherein the operational amplifier comprises:
a first input pair, a second input pair, a switch and a first current mirror,
wherein the first input pair comprises a different type of MOS transistor from the second input pair;
the switch is connected to the first input pair and the first current mirror, and the input pair functioning is configured to output voltage; and
the first current mirror is further connected to the second input pair;
the method comprises:
receiving, by both the first input pair and the second input pair, differential voltage input;
determining, by the switch, which one of the first input pair or the second input pair is functioning;
copying, by the first current mirror, a current passing through the switch to the second input pair, such that the operational amplifier has a substantially constant transconductance no matter which of the first input pair and the second input pair is functioning,
wherein the first input pair comprises a first MOS transistor and a second MOS transistor, the second input pair comprises a third MOS transistor and a fourth MOS transistor, the switch comprises a fifth MOS, and the operational amplifier further comprises a second current mirror, a third current mirror and a load unit;
wherein any two of a first node of the first MOS transistor, a first node of the second MOS transistor, a first current source and a first node of the fifth MOS transistor are connected; a second node of the first MOS transistor is connected to a second node of the fourth MOS transistor and is also configured to receive a positive input, a third node of the first transistor is connected to both a second port of the third current mirror and a first port of the load unit; a second node of the second MOS transistor is connected to a second node of the third MOS transistor and is also configured to receive a negative input, a third node of the second transistor is connected to both a second port of the second current mirror and a second node of the load unit and is also configured to output voltage;
first nodes of both the third and fourth MOS transistors are connected to a first port of the first current mirror, a third node of the third MOS transistor is connected to a first port of the third current mirror, a third node of the fourth MOS transistor is connected to a first port of the second current mirror;
a second node of the fifth MOS transistor is connected to a voltage source, a third node of the fifth MOS transistor is connected to a second port of the first current mirror, wherein
the third current mirror comprises a sixth MOS transistor and a seventh MOS transistor, first nodes of both the sixth and the seventh MOS transistors are connected to a first power source, both second and third nodes of the sixth MOS transistor are connected to both a second node of the seventh MOS transistor and the third node of the third MOS transistor, and the first port of the third current mirror comprises the third node of the sixth MOS transistor, and the second port of the third current mirror comprises a third node of the seventh MOS transistor;

the second current mirror comprises an eighth MOS transistor and a ninth MOS transistor, first nodes of both the eighth and the ninth MOS transistors are connected to the first power source, both second and third nodes of the ninth MOS transistor are connected to a second node of the eighth MOS transistor and the third node of the fourth MOS transistor, and the first port of the second current mirror comprises the third node of the ninth MOS transistor, and the second port of the second current mirror comprises a third node of the eighth MOS transistor; and the first current mirror comprises a tenth MOS transistor and an eleventh MOS transistor, first nodes of both the tenth and the eleventh MOS transistors are connected to the second power source, both second and third nodes of the tenth MOS transistor are connected to both a second node of the eleventh MOS transistor and the third node of the fifth MOS transistor, and the first port of the first current mirror comprises a third node of the eleventh MOS transistor, and the second port of the first current mirror comprises the third node of the tenth MOS transistor.

10. The method of claim 9, wherein an increase of transconductance of the first input pair is compensated by a decrease of transconductance of the second input pair.

11. The method of claim 9, wherein the load unit comprises a twelfth MOS transistor and a thirteenth MOS transistor;

wherein first nodes of both the twelfth MOS transistor and the thirteenth MOS transistor are connected to the second power source, a second node and a third node of the twelfth MOS transistor are both connected to a second node of the thirteenth MOS transistor, a third node of the twelfth MOS transistor comprises the first node of the load unit and a third node of the thirteenth MOS comprises the second node of the load unit.

12. The method of claim 9, wherein the load unit comprises a twelfth MOS transistor, a thirteenth MOS transistor, a fourteenth MOS transistor and a second current source;

wherein first nodes of all the twelfth MOS transistor, the thirteenth MOS transistor and the fourteenth MOS transistor are connected to the second power source, a second node of the twelfth MOS transistor is connected to second nodes of both the thirteenth MOS transistor and the fourteenth MOS transistor, the second node of the fourteenth MOS transistor is also connected to both a third node of the fourteenth MOS transistor and the second current source, a third node of the twelfth MOS transistor comprises the first node of the load unit and a third node of the thirteenth MOS transistor comprises the second node of the load unit, wherein the first node and the second node of the load unit are configured to output differential output voltage.

13. The method of claim 9, wherein the first, the second, the fifth, the sixth, the seventh, the eighth and the ninth MOS transistors are PMOS transistors, the third, the fourth, the tenth, and the eleventh MOS transistors are NMOS transistors; and the first node of each of the transistors is a source, the second node of each of the transistors is a gate, and the third node of each of the transistors is a drain, the first power source comprises a positive power source, and the second power source comprises ground.

14. The method of claim 11, wherein the twelfth and the thirteenth MOS transistors are NMOS transistors, and the first node of each of the twelfth and the thirteenth MOS transistors is a source, the second node of each of the twelfth and the thirteenth transistors is a gate, and the third node of each of the twelfth and the thirteenth transistors is a drain.

15. The method of claim 9, wherein the first, the second, the fifth, the sixth, the seventh, the eighth and the ninth MOS transistors are NMOS transistors, the third, the fourth, the tenth, and the eleventh MOS transistors are PMOS transistors; and the first node of each of the transistors is a source, the second node of each of the transistors is a gate, and the third node of each of the transistors is a drain, the first power source comprises a ground, and the second power source comprises a positive power supply.

16. The method of claim 11, wherein the twelfth and the thirteenth MOS transistors include PMOS transistors, and the first node of each of the twelfth and the thirteenth MOS transistors include a source, the second node of each of the twelfth and the thirteenth transistors include a gate, and the third node of each of the twelfth and the thirteenth transistors include a drain.

* * * * *